US009620045B2

(12) United States Patent
Wang et al.

(10) Patent No.: US 9,620,045 B2
(45) Date of Patent: Apr. 11, 2017

(54) ARRAY SUBSTRATE AND DETECTING CIRCUIT THEREOF

(71) Applicant: Shenzhen China Star Optoelectronics Technology Co., Ltd., Shenzhen, Guangdong (CN)

(72) Inventors: Zui Wang, Guangdong (CN); Jinbo Guo, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 14/418,624

(22) PCT Filed: Jan. 20, 2015

(86) PCT No.: PCT/CN2015/071132
§ 371 (c)(1),
(2) Date: May 10, 2016

(87) PCT Pub. No.: WO2016/106887
PCT Pub. Date: Jul. 7, 2016

(65) Prior Publication Data
US 2016/0247428 A1  Aug. 25, 2016

(30) Foreign Application Priority Data

Dec. 31, 2014  (CN) .......................... 2014 1 0856207

(51) Int. Cl.
*G09G 3/00*  (2006.01)
*G01R 31/02*  (2006.01)
(Continued)

(52) U.S. Cl.
CPC ............. *G09G 3/006* (2013.01); *G01R 31/02* (2013.01); *G02F 1/1362* (2013.01); *G09G 3/00* (2013.01);
(Continued)

(58) Field of Classification Search
None
See application file for complete search history.

(56) References Cited

U.S. PATENT DOCUMENTS

| 2009/0294771 A1 | 12/2009 | Kim et al. |
| 2010/0110324 A1 | 5/2010 | Chang |
| 2016/0225798 A1* | 8/2016 | Wang ................... G09G 3/006 |

FOREIGN PATENT DOCUMENTS

| CN | 102116945 A | 7/2011 |
| CN | 103617772 A | 3/2014 |

(Continued)

OTHER PUBLICATIONS

International Search Report and Written Opinion, Jan. 20, 2015, China.

Primary Examiner — Kenneth B Lee, Jr.
(74) Attorney, Agent, or Firm — Kim Winston LLP

(57) ABSTRACT

An array substrate and a detecting circuit thereof are disclosed. The detecting circuit comprises a detecting unit, which comprises a first to a sixth detecting lines; a switching signal access unit, used for receiving a switching control signal; a detecting signal access unit, used for receiving a first detecting signal or a second detecting signal; and a switching unit, comprising a first switching line and a second switching line, which are connected among the detecting unit, the switching signal access unit and the detecting signal access unit. The array substrate comprises an active area and a detecting circuit.

20 Claims, 6 Drawing Sheets

(51) Int. Cl.
*G02F 1/1362* (2006.01)
*G09G 3/36* (2006.01)

(52) U.S. Cl.
CPC ... *G09G 3/36* (2013.01); *G02F 2001/136254* (2013.01); *G09G 2300/04* (2013.01); *G09G 2320/0242* (2013.01); *G09G 2330/04* (2013.01); *G09G 2330/08* (2013.01); *G09G 2330/12* (2013.01)

(56) References Cited

FOREIGN PATENT DOCUMENTS

| | | |
|---|---|---|
| CN | 104077989 A | 10/2014 |
| CN | 104111550 A | 10/2014 |

\* cited by examiner

ARRAY SUBSTRATE AND DETECTING CIRCUIT THEREOF

CROSS REFERENCE TO RELATED APPLICATION

The present application claims benefit of Chinese patent application CN 201410856207.9, entitled "Array Substrate and Detecting Circuit Thereof" and filed on Dec. 31, 2014, which is incorporated herein by reference.

FIELD OF THE INVENTION

The present disclosure relates to the technical field of display, and particularly to an array substrate and a detecting circuit thereof.

BACKGROUND OF THE INVENTION

During the traditional design of circuits in a display panel, peripheral wirings, which are also called as shorting bars, are usually arranged on the outside of the active area surrounding the panel. Odd-numbered scanning lines as well as even-numbered scanning lines are connected with the peripheral wirings respectively. That is, the odd-numbered scanning lines and the even-numbered scanning lines are short-circuited respectively at the peripheral area of the active area of the whole panel. Through this kind of design, whether short-circuit or open circuit exists in the display panel can be detected through providing different electronic signals to the odd-numbered scanning lines and the even-numbered scanning lines during the detection step of Thin Film Transistor (TFT) manufacturing process. At the same time, other kinds of defects can also be detected through providing different data signals. The shorting bars are disconnected or removed after the detection step, and the normal display of the finished products would not be affected.

In order to eliminate the color shift phenomena of the vertical alignment liquid crystal display device under wide viewing angles, a charge sharing pixel design is usually used. FIG. 1 schematically shows a circuit structure of a charge sharing array substrate provided with shorting bars in the prior art. The turned-on and turned-off states of a share gate line of row N is controlled by a signal of a charge gate line of row N+2. If short-circuit occurs between the charge gate line and the share gate line of row N, the above short-circuit defect cannot be detected during the manufacturing of TFT through the above detection method, in which the odd-numbered scanning lines and the even-numbered scanning lines are connected with the shorting bars respectively, since the share gate line of row N is connected with the charge gate line of row N+2, and N and N+2 are both odd numbers or even numbers. In this case, the defect can only be detected through cell lighting or even finished product detection. Consequently, the defect would exist in the horizontal scanning lines of the display panel, and thus the qualified rate of the products would decrease.

In the prior art, there is an array substrate in which three detecting lines are arranged in the area of shorting bars, as shown in FIG. 2. The detecting lines G1, G2, and G3 are connected with three consecutive rows of charge gate lines in the active area respectively, and the detecting signal is provided to the three detecting lines in sequence. The short-circuit defect between the charge gate line and the share gate line of the same row can be detected through the above method, but the detection thereof is more complicated and time-consuming. In particular, in mass-production, the probability of the short-circuit defect is rather low since the manufacturing procedures have become mature. The detection efficiency would be reduced if the above detection method is still used, and thus the production capacity thereof would be adversely influenced.

SUMMARY OF THE INVENTION

The technical problem to be solved by the present disclosure is that the detection method in the manufacturing of TFT is so rigid, that it cannot be switched over according to the qualified rate conditions during each period of the manufacturing procedures and thus the detection efficiency is low.

In order to solve the above technical problem, the embodiment of the present disclosure firstly provides a detecting circuit for an array substrate, comprising:

a detecting unit, comprising a first to a sixth detecting lines;

a switching signal access unit, used for receiving a switching control signal;

a detecting signal access unit, used for receiving a first detecting signal or a second detecting signal; and a switching unit, comprising a first switching line and a second switching line, which are connected among the detecting unit, the switching signal access unit and the detecting signal access unit, wherein under a control of the switching control signal, the first switching line is turned on, so that the first to the sixth detecting lines are divided into three groups, and the three groups of detecting lines are provided with the first detecting signal in sequence, or the second switching line is turned on, so that the first to the sixth detecting lines are divided into two groups, and the two groups of detecting lines are provided with the second detecting signal in sequence.

According to one embodiment, said first switching line comprises:

a first control line, connected with the switching signal access unit; and a first to a sixth transistors, the gates thereof all being coupled with the first control line, the first ends thereof each being coupled with a corresponding line of the first to the sixth detecting lines, wherein the second ends of the first transistor and the fourth transistor are both connected with a first signal sharing point, the second ends of the second transistor and the fifth transistor are both connected with a second signal sharing point, and the second ends of the third transistor and the sixth transistor are both connected with a third signal sharing point.

According to one embodiment, when the first switching line is turned on, the three groups of detecting lines are a group consisting of the first and the fourth detecting lines, a group consisting of the second and the fifth detecting lines, and a group consisting of the third and the sixth detecting lines respectively.

According to one embodiment, said second switching line comprises:

a second control line, connected with the switching signal access unit; and a seventh to a twelfth transistors, the gates thereof all being coupled with the first control line, the first ends thereof each being coupled with a corresponding line of the first to the sixth detecting lines, wherein the second ends of the seventh transistor, the ninth transistor, and the eleventh transistor are all connected with a fourth signal sharing point, and the second ends of the eighth transistor, the tenth transistor, and the twelfth transistor are all connected with a fifth signal sharing point.

According to one embodiment, when the second switching line is turned on, the two groups of detecting lines are a group consisting of the first, the third and the fifth detecting lines, and a group consisting of the second, the fourth and the sixth detecting lines respectively.

According to one embodiment, the detecting signal access unit comprises a first to a third detecting points;

wherein the first ends of the first to the third detecting points each are connected with a corresponding signal sharing point of the first to the third signal sharing points, so as to provide the first detecting signal to the three groups of detecting lines in sequence; and wherein the second ends of the first and the third detecting points each are connected with a corresponding signal sharing point of the fourth and the fifth signal sharing points, so as to provide the second detecting signal to the two groups of detecting lines in sequence.

According to one embodiment, the switching signal access unit comprises a first control switch and a second control switch, the first control switch being connected with the first control line so as to provide a first control signal, the second control switch being connected with the second control line so as to provide a second control signal, the polarity of the first control signal being opposite to that of the second control signal.

The embodiment of the present disclosure further provides an array substrate, which comprises an active area and the aforesaid detecting circuit for the array substrate, wherein said active area comprises a plurality rows of sub area, each row of sub area being provided with a charge line and a share line, the share line of each row of sub area being connected with the charge line of the sub area whose row number is added by an even number; and wherein the first to the sixth detecting lines of said detecting unit each are connected with a corresponding charge line of the charge lines of six consecutive rows of sub area of the active area.

According to one embodiment, when the first switching line is turned on, the first detecting signal is provided to the three groups of detecting lines in sequence so as to detect defects of the charge line and the share line of each row of sub area; and when the second switching line is turned on, the second detecting signal is provided to the two groups of detecting lines in sequence so as to detect defects of the charge line and the share line of adjacent rows of sub area.

According to one embodiment, when the first switching line is turned on, a difference between the row numbers of the sub areas which receive the first detecting signal through a corresponding charge line is a multiple of three.

The following beneficial effects can be brought about according to the present disclosure. The detecting circuit is provided with two switches and three detecting points, so that different detection modes can be switched over from one to another through controlling the turned-on or turned-off states of the two switches. Therefore, the two detection modes can be switched over from one to another according to the production conditions thereof, and thus the detection efficiency can be improved. With respect to the charge sharing array substrate, six detecting lines are arranged in the detection area, and two detection modes are provided. The six detecting lines are provided with different detecting signals under the two detection modes, and different detection results can be generated.

Other features and advantages of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the present disclosure or the prior art and constitute one part of the description. The drawings are not used for limiting the present disclosure. In the drawings.

DETAILED DESCRIPTION OF THE EMBODIMENTS

The present disclosure will be illustrated in detail hereinafter in combination with the accompanying drawings to make the purpose, technical solutions, and advantages of the present disclosure more clear. It should be noted that, as long as there is no conflict, all the technical features mentioned in all the embodiments may be combined together in any manner, and the technical solutions obtained in this manner all fall within the scope of the present disclosure.

Figure 1:
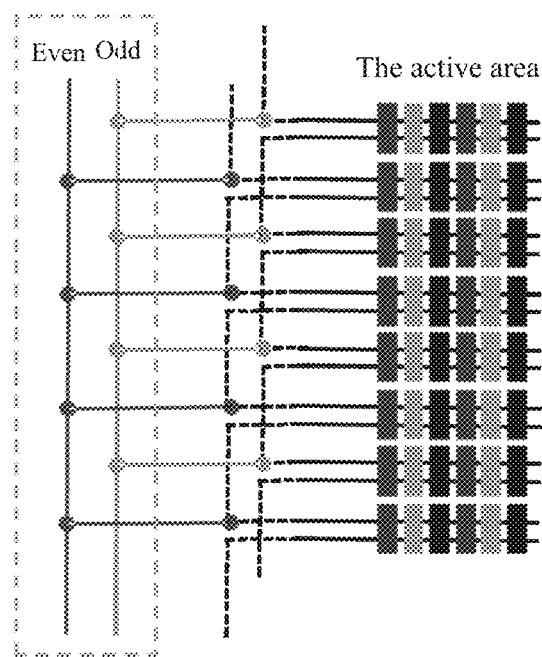
FIG. 1 schematically shows a circuit structure of a charge sharing array substrate provided with shorting bars in the prior art.
Figure 2:
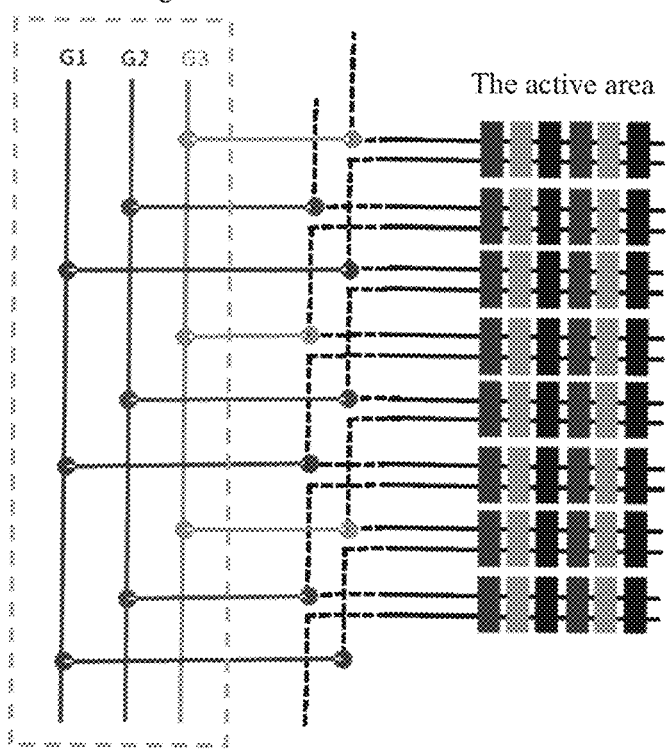
FIG. 2 schematically shows a circuit structure of another charge sharing array substrate provided with shorting bars in the prior art.
Figure 3:
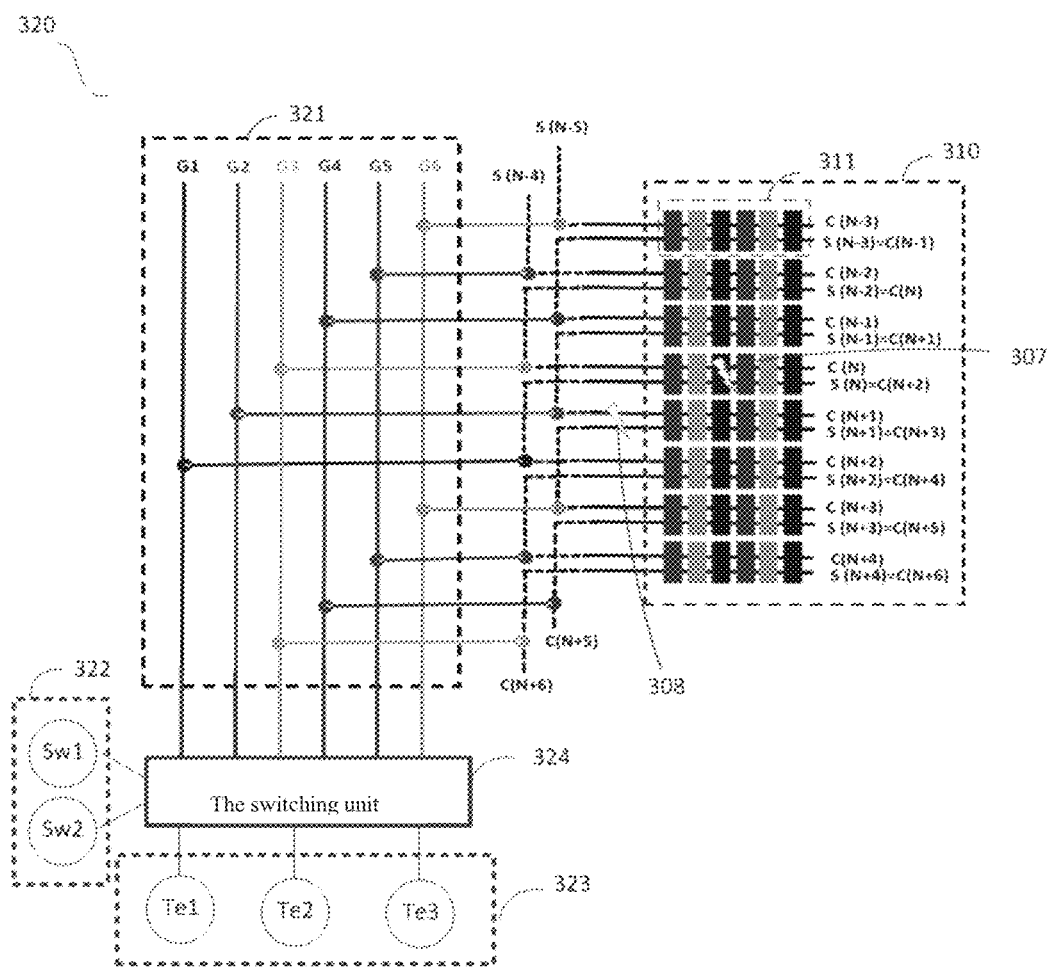
FIG. 3 schematically shows a circuit structure of an array substrate according to one embodiment of the present disclosure.

FIG. 3 schematically shows a circuit structure of an array substrate according to the present embodiment. The array substrate comprises an active area 310, and a detecting circuit 320 which is arranged on one side of the active area 310.

The active area 310 is provided with a plurality rows of sub area 311, which are arranged in a form of an array, so that a sub pixel array can be formed during the following manufacturing procedure. Each row of sub area is provided with a charge line and a share line. The share line of each row of sub area is connected with the charge line of the sub area whose row number is added by two. That is, the charge line of each row of sub area provides signals to the share line of a previous row which is spaced from the aforesaid row by one row.

For example, as shown in FIG. 3, the sub area of row N is provided with a charge line C(N) and a share line S(N), and the sub area of row N−2 is provided with a charge line C(N−2) and a share line S(N−2). The share line S(N−2) of row N−2 is connected with the charge line C(N) of row N, and thus the turned-on or turned-off state of the share line S(N−2) can be controlled by the scanning signal of the charge line C(N).

The detecting circuit 320 comprises a detecting unit 321, a switching signal access unit 322, a detecting signal access unit 323, and a switching unit 324.

The detecting unit 321 is provided with a first to a sixth detecting lines G1 to G6, which are used for providing detecting signals to the active area 310, so that the defects of the charge lines and the share lines in the active area 310 can be detected. The first to the sixth detecting lines G1 to G6 each are connected with a corresponding charge line of the charge lines of six consecutive rows of sub area of the active area.

As shown in FIG. 3, the first detecting line G1 is connected with the charge line C(N+2) of the sub area of row N+2, and the second detecting line G2 is connected with the charge line C(N+1) of the sub area of row N+1. Similarly, the third to the sixth detecting lines G3 to G6 each are connected with a corresponding charge line of the charge lines of the sub areas of row N, row N−1, row N−2, and row N−3.

The switching signal access unit 322 is used for receiving the switching control signal. As shown in FIG. 3, according to one preferred embodiment, the switching signal access unit comprises a first control switch Sw1 and a second control switch Sw2, which are used for receiving a first control signal and a second control signal respectively.

The detecting signal access unit 323 is used for receiving a first detecting signal or a second detecting signal. The detecting signal access unit 323 is provided with a first detecting point Te1, a second detecting point Te2, and a third detecting point Te3 which are separated from one another.

The switching unit 324 is connected among the detecting unit 321, the switching signal access unit 322 and the detecting signal access unit 323. Different detection modes can be switched over according to the first control signal and the second control signal.

Figure 4:
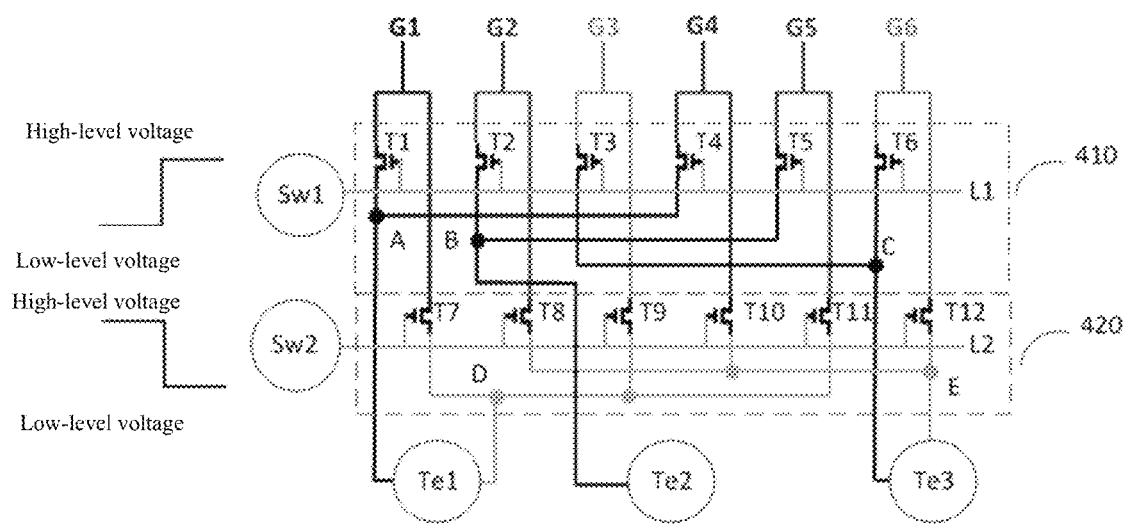
FIG. 4 schematically shows a circuit structure of a detecting circuit according to the embodiment of the present disclosure.

According to one preferred embodiment, the circuit structure of the switching unit 324 is shown in FIG. 4. The switching unit comprises a first switching line 410 and a second switching line 420, whereby different detection modes can be realized.

The first switching line 410 comprises a first control line L1 and a first to a sixth transistors T1 to T6. The first control line L1 is connected with the first control switch Sw1 and used for receiving the first control signal. The gates of T1 to T6 are all coupled with the first control line L1, and the first ends thereof each are coupled with a corresponding line of the first to the sixth detecting lines G1 to G6. The second ends of the first transistor T1 and the fourth transistor T4 are both connected with a first signal sharing point A, the second ends of the second transistor T2 and the fifth transistor T5 are both connected with a second signal sharing point B, and the second ends of the third transistor T3 and the sixth transistor T6 are both connected with a third signal sharing point C.

The first switching line 410 is connected with the detecting signal access unit 323 and used for receiving the first detecting signal. Specifically, the first end of the first detecting point Te1 is connected with the first signal sharing point A, the first end of the second detecting point Te2 is connected with the second signal sharing point B, and the first end of the third detecting point Te3 is connected with the first signal sharing point C.

The second switching line 420 comprises a second control line L2 and a seventh to a twelfth transistors T7 to T12. The second control line L2 is connected with the second control switch Sw2 and used for receiving the second control signal. The gates of T7 to T12 are all coupled with the second control line L2, and the first ends thereof each are coupled with a corresponding line of the first to the sixth detecting lines G1 to G6. The second ends of the seventh transistor T7, the ninth transistor T9, and the eleventh transistor T11 are all connected with a fourth signal sharing point D, and the second ends of the eighth transistor T8, the tenth transistor T10, and the twelfth transistor T12 are all connected with a fifth signal sharing point E.

The second switching line 420 is connected with the detecting signal access unit 323 and used for receiving the second detecting signal. Specifically, the second end of the first detecting point Te1 is connected with the fourth signal sharing point D, and the second end of the third detecting point Te3 is connected with the fifth signal sharing point E.

Figure 5:
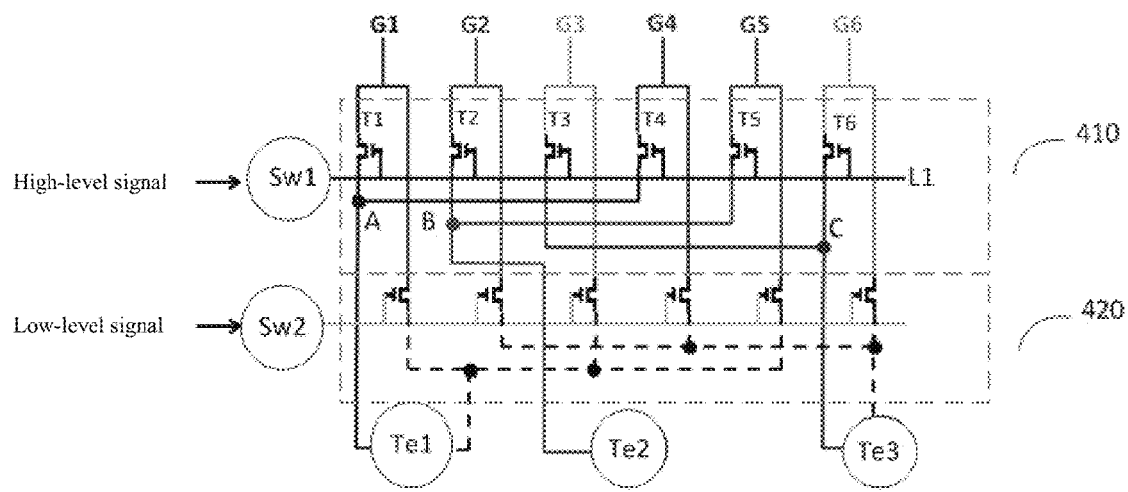
FIG. 5 schematically shows a working state of the detecting circuit under a first detection mode according to the embodiment of the present disclosure.
Figure 6:
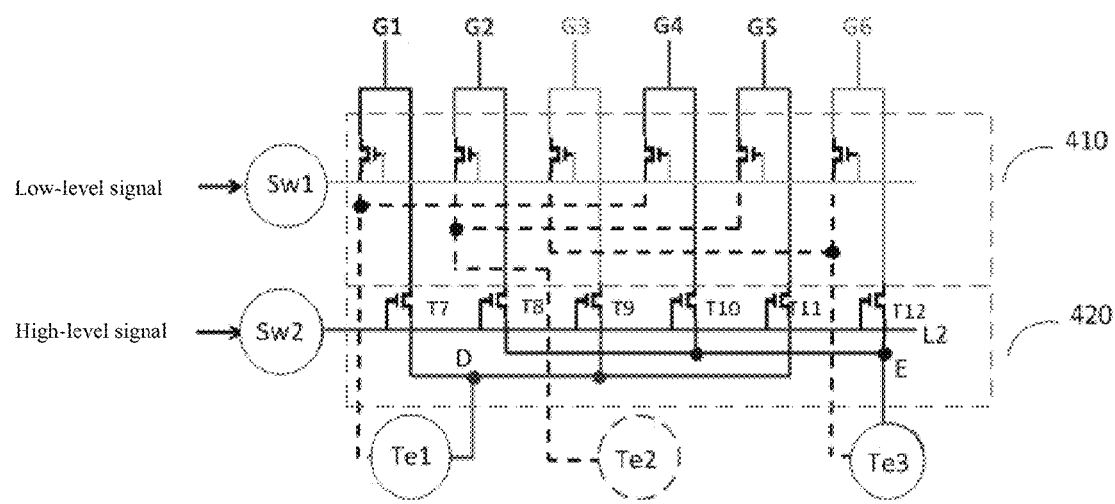
FIG. 6 schematically shows a working state of the detecting circuit under a second detection mode according to the embodiment of the present disclosure.

The two different detection modes of the switching unit 324 will be illustrated hereinafter with reference to FIG. 3, FIG. 5, and FIG. 6.

Specifically, under a first detection mode, the first to the sixth detecting lines are divided into three groups, and the three groups of detecting lines are provided with the first detecting signal in sequence; and under a second detection mode, the first to the sixth detecting lines are divided into two groups, and the two groups of detecting lines are provided with the second detecting signal in sequence.

The first detection mode is applicable to an initial stage of mass-production of the array substrate. Since the cleanness of the manufacturing environment is poor, and the photolithographic and exposing procedures would be affected by dust particles, the short-circuit defect would occur easily between the charge line and the share line of each row of sub area. The short-circuit defect can occur to the sub area in the active area, or occur to the bridging area outside the sub area. For example, as shown in FIG. 3, at a short-circuit position 307 in the sub area of row N, the short-circuit occurs between the charge line C(N) and the share line S(N); and at a short-circuit position 308 outside the sub area of row N+1, the short-circuit occurs between the charge line C(N+1) and the share line S(N+1).

Under the circumstances, the first detection mode is applicable. That is, the first control signal is provided to the first control switch Sw1, and the first detecting signal is provided to the first to the third detecting points Te1 to Te3. As shown in FIG. 5, the first control signal has a high-level voltage, so that the first control switch Sw1 is turned on, and a high-level signal is provided to the gates of the first to the sixth transistors T1 to T6 through the first control line L1. In this case, T1 to T6 are all turned on, and thus the first to the sixth detecting lines G1 to G6 all can receive the first detecting signal provided by the first to the third detecting points Te1 to Te3. In order to avoid the bad effect brought about by the second switching line 420, preferably, the second control signal with a low-level voltage can be provided to the second control switch Sw2, so that the second control switch Sw2 is in a stable turned-off state.

The first detecting signal can comprise three consecutive detecting time periods t1, t2, and t3.

During the time period t1, the detecting signal is provided to the first detecting point Te1, and thus the detecting signal is provided to the detecting lines G1 and G4 at the same time through the first end of Te1 and the first signal sharing point A. At this time, no detecting signal is provided to the second detecting point Te2 or the third detecting point Te3, and thus no detecting signal is provided to G2, G5, G3, or G6. Under normal circumstance, the charge line C(N+2) of row N+2 and the share line S(N) of row N can both receive the first detecting signal from the detecting line G1, and similarly, the charge line C(N−1) of row N−1 and the share line S(N−3) of row N−3 can both receive the first detecting signal from the detecting line G4. Further, the charge line C(N+5) of row N+5 and the share line S(N+3) of row N+3 can also receive the first detecting signal from the detecting line G4. That is, the row numbers of the sub areas which receive the first detecting signal through a corresponding charge line are N−1, N+2, and N+5, with a difference between the row numbers of 3 or 6.

As shown in FIG. 3, if a short-circuit defect exists at the position 307 of the array substrate, the charge line C(N) of row N can also receive the first detecting signal since the charge line C(N) and the share line S(N) of row N are short-circuit connected, and thus the detecting line G3 can receive the first detecting signal. In this case, the third detecting point can receive the first detecting signal through the third signal sharing point C. Therefore, the short-circuit defect between the charge line and the share line of row N can be detected through the detection method according to the present embodiment.

It can be easily understood that, during the time period t1, if the charge line C(N+2) of row N+2 or the share line S(N) of row N cannot receive the first detecting signal, an open circuit occurs to the charge line C(N+2) or the share line S(N).

During the time period t2, the detecting signal is provided to the second detecting point Te2, and thus the detecting signal is provided to the detecting lines G2 and G5 at the same time through the first end of Te2 and the second signal sharing point B. At this time, no detecting signal is provided to G1, G4, G3, or G6. Under normal circumstance, the charge line C(N+1) of row N+1 and the share line S(N−1) of row N−1 can both receive the first detecting signal from the detecting line G2, and the charge line C(N−2) of row N−2 and the share line S(N−4) of row N−4 can both receive the first detecting signal from the detecting line G5. That is, the row numbers of the sub areas which receive the first detecting signal through a corresponding charge line are N+1 and N−2, with a difference between the row numbers of 3.

If a short-circuit defect exists at the position 308 of the array substrate, the charge line C(N+3) of row N+3 can also receive the first detecting signal since the charge line C(N+3) of row N+3 and the share line S(N+1) of row N+1 are connected, and thus the detecting line G6 can receive the first detecting signal. In this case, the third detecting point can receive the first detecting signal through the third signal sharing point C. Therefore, the short-circuit defect between the charge line and the share line of row N+1 can be detected through the detection method according to the present embodiment.

It can be easily understood that, during the time period t2, if the charge line C(N+1) of row N+1 or the share line S(N−1) of row N−1 cannot receive the first detecting signal, it means that an open circuit occurs to the charge line C(N+1) or the share line S(N−1).

Similarly, during the time period t3, the detecting signal is provided to the third detecting point Te3, and thus the detecting signal is provided to the detecting lines G3 and G6 at the same time through the first end of Te3 and the third signal sharing point C. At this time, no detecting signal is provided to the first detecting point Te1 or the second detecting point Te2. The short-circuit defect between the charge line and the share line of row N−1 can be detected.

Therefore, under the first detection mode, the first to the sixth detecting lines G1 to G6 can be divided into three groups, i.e., the first group consisting of G1 and G4, the second group consisting of G2 and G5, and the third group consisting of G3 and G6. The three groups of detecting lines are provided with the first detecting signal in sequence, so that accurate detection can be performed and the detection rate of the short-circuit defect in the array substrate can be improved. However, the detection time under this detection mode is relatively long, and the efficiency thereof is relatively low.

The second detection mode is applicable to the mass-production period. Since the manufacturing procedures have become mature, the probability that the short-circuit defect occurs between the charge line and the share line of each row is rather low. Under the circumstances, the detection efficiency would be reduced if the detection is still performed according to the first detection mode.

Under the circumstances, the second detection mode is applicable. That is, the second control signal is provided to the second control switch Sw2, and the second detecting signal is provided to the first and the third detecting points Te1 and Te3. As shown in FIG. 6, the second control signal has a high-level voltage, so that the second control switch Sw2 is turned on, and a high-level signal is provided to the gates of the seventh to the twelfth transistors T7 to T12 through the second control line L2. In this case, T7 to T12 are all turned on, and thus the first to the sixth detecting lines G1 to G6 all can receive the second detecting signal provided by the first and the third detecting points Te1 and Te3. Similarly, in order to avoid the bad effect brought about by the first switching line 410, preferably, the first control signal with a low-level voltage can be provided to the first control switch Sw1, so that the first control switch Sw1 is in a stable turned-off state.

Under the second detection mode, the first to the sixth detecting lines G1 to G6 can be divided into two groups, i.e., the first group consisting of G1, G3, and G5, and the second group consisting of G2, G4, and G6. The two groups of detecting lines are provided with the second detecting signal in sequence. The second detecting signal can comprise two consecutive detecting time periods t1 and t2.

During the time period t1, the second detecting signal is provided to the first detecting point Te1, and thus the second detecting signal is provided to the detecting lines G1, G3, and G5 at the same time through the second end of Te1 and the fourth signal sharing point D. At this time, no detecting signal is provided to G2, G4, or G6, and thus no detecting signal is provided to the second detecting point Te2 or the third detecting point Te3. If short-circuit occurs between the charge line of the sub area of row N and the charge line of the sub area of row N−1, the charge line C(N−1) then can receive the second detecting signal from G3. In this case, the detecting line G4 can receive the second detecting signal, and the third detecting point Te3 can also receive the second detecting signal. Therefore, the short-circuit defect between the charge lines of two adjacent rows of sub area can be detected.

During the time period t2, the second detecting signal is provided to the third detecting point Te3, and thus the second detecting signal is provided to the detecting lines G2, G4, and G6 at the same time through the second end of Te3 and the fifth signal sharing point E. At this time, no detecting signal is provided to G1, G3, or G5. Therefore, the defects of the charge line and the share line of adjacent rows of sub area can be detected in a similar manner.

The detection efficiency of this detection mode is relatively high, and thus the production capacity can be improved compared with detection under the first detection mode. Under this detection mode, whether short-circuit or open circuit exists in the array substrate can be detected through providing different electronic signals to the odd-numbered scanning lines and the even-numbered scanning lines respectively. At the same time, other kinds of defects can also be detected through providing different data signals.

According to the present disclosure, in the N+2 charge sharing array substrate, six detecting lines are arranged in the detection area, and two detection modes are provided. The six detecting lines are provided with different detecting signals under the two detection modes, and different detection results can be generated. The detecting circuit is provided with two switches and three detecting points, so that different detection modes can be switched over from one to another through controlling the turned-on or turned-off states of the two switches. Therefore, the two detection modes can be switched over from one to another according to the production conditions thereof, and thus the detection efficiency can be improved.

Under the second detection mode, since only two kinds of detecting signals are needed, only two detecting points should be arranged in the access area of the detecting signal. Therefore, the outside detection machine configuration can be simplified, and the unnecessary signal generation device and detection device can be saved.

According to the present disclosure, the N+2 wiring bridging mode is used in the active area, and the share line of each row of sub area is connected with the charge line of the sub area whose row number is added by two. That is, the charge line of each row of sub area provides signals to the share line of a previous row which is spaced from the aforesaid row by one row. It can be easily understood by those skilled in the art that, with respect to the N+4 or N+6 wiring bridging mode, as long as the condition that the share line of each row of sub area is connected with the charge line of the sub area whose row number is added by an even number is met, the detection can be performed by the detecting circuit provided by the present disclosure.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A detecting circuit for an array substrate, comprising:
   a detecting unit, comprising a first to a sixth detecting lines;
   a switching signal access unit, used for receiving a switching control signal;
   a detecting signal access unit, used for receiving a first detecting signal or a second detecting signal; and
   a switching unit, comprising a first switching line and a second switching line, which are connected among the detecting unit, the switching signal access unit and the detecting signal access unit,
   wherein under a control of the switching control signal, the first switching line is turned on, so that the first to the sixth detecting lines are divided into three groups, and the three groups of detecting lines are provided with the first detecting signal in sequence, or the second switching line is turned on, so that the first to the sixth detecting lines are divided into two groups, and the two groups of detecting lines are provided with the second detecting signal in sequence.

2. The detecting circuit for the array substrate according to claim 1, wherein said first switching line comprises:
   a first control line, connected with the switching signal access unit; and
   a first to a sixth transistors, the gates thereof all being coupled with the first control line, the first ends thereof each being coupled with a corresponding line of the first to the sixth detecting lines,
   wherein the second ends of the first transistor and the fourth transistor are both connected with a first signal sharing point, the second ends of the second transistor and the fifth transistor are both connected with a second signal sharing point, and the second ends of the third transistor and the sixth transistor are both connected with a third signal sharing point.

3. The detecting circuit for the array substrate according to claim 2, wherein when the first switching line is turned on, the three groups of detecting lines are a group consisting of the first and the fourth detecting lines, a group consisting of the second and the fifth detecting lines, and a group consisting of the third and the sixth detecting lines respectively.

4. The detecting circuit for the array substrate according to claim 2, wherein said second switching line comprises:
   a second control line, connected with the switching signal access unit; and
   a seventh to a twelfth transistors, the gates thereof all being coupled with the first control line, the first ends thereof each being coupled with a corresponding line of the first to the sixth detecting lines,
   wherein the second ends of the seventh transistor, the ninth transistor, and the eleventh transistor are all connected with a fourth signal sharing point, and the second ends of the eighth transistor, the tenth transistor, and the twelfth transistor are all connected with a fifth signal sharing point.

5. The detecting circuit for the array substrate according to claim 4, wherein when the second switching line is turned on, the two groups of detecting lines are a group consisting of the first, the third and the fifth detecting lines, and a group consisting of the second, the fourth and the sixth detecting lines respectively.

6. The detecting circuit for the array substrate according to claim 4, wherein the detecting signal access unit comprises a first to a third detecting points;
   wherein the first ends of the first to the third detecting points each are connected with a corresponding signal sharing point of the first to the third signal sharing points, so as to provide the first detecting signal to the three groups of detecting lines in sequence; and
   wherein the second ends of the first and the third detecting points each are connected with a corresponding signal sharing point of the fourth and the fifth signal sharing points, so as to provide the second detecting signal to the two groups of detecting lines in sequence.

7. The detecting circuit for the array substrate according to claim 6, wherein the switching signal access unit comprises a first control switch and a second control switch, the first control switch being connected with the first control line so as to provide a first control signal, the second control switch being connected with the second control line so as to provide a second control signal, the polarity of the first control signal being opposite to that of the second control signal.

8. An array substrate, comprising an active area and a detecting circuit for the array substrate, wherein said detecting circuit for the array substrate comprises:
　　a detecting unit, comprising a first to a sixth detecting lines;
　　a switching signal access unit, used for receiving a switching control signal;
　　a detecting signal access unit, used for receiving a first detecting signal or a second detecting signal; and
　　a switching unit, comprising a first switching line and a second switching line, which are connected among the detecting unit, the switching signal access unit and the detecting signal access unit,
　　wherein under a control of the switching control signal, the first switching line is turned on, so that a first to a sixth detecting lines are divided into three groups, and the three groups of detecting lines are provided with the first detecting signal in sequence, or
　　the second switching line is turned on, so that a first to a sixth detecting lines are divided into two groups, and the two groups of detecting lines are provided with the second detecting signal in sequence;
wherein said active area comprises a plurality rows of sub area, each row of sub area being provided with a charge line and a share line, the share line of each row of sub area being connected with the charge line of the sub area whose row number is added by an even number; and
wherein the first to the sixth detecting lines of said detecting unit each are connected with a corresponding charge line of the charge lines of six consecutive rows of sub area of the active area.

9. The array substrate according to claim 8, wherein said first switching line comprises:
　　a first control line, connected with the switching signal access unit; and
　　a first to a sixth transistors, the gates thereof all being coupled with the first control line, the first ends thereof each being coupled with a corresponding line of the first to the sixth detecting lines,
　　wherein the second ends of the first transistor and the fourth transistor are both connected with a first signal sharing point, the second ends of the second transistor and the fifth transistor are both connected with a second signal sharing point, and the second ends of the third transistor and the sixth transistor are both connected with a third signal sharing point.

10. The array substrate according to claim 9, wherein when the first switching line is turned on, the three groups of detecting lines are a group consisting of the first and the fourth detecting lines, a group consisting of the second and the fifth detecting lines, and a group consisting of the third and the sixth detecting lines respectively.

11. The array substrate according to claim 9, wherein said second switching line comprises:
　　a second control line, connected with the switching signal access unit; and
　　a seventh to a twelfth transistors, the gates thereof all being coupled with the first control line, the first ends thereof each being coupled with a corresponding line of the first to the sixth detecting lines,
　　wherein the second ends of the seventh transistor, the ninth transistor, and the eleventh transistor are all connected with a fourth signal sharing point, and the second ends of the eighth transistor, the tenth transistor, and the twelfth transistor are all connected with a fifth signal sharing point.

12. The array substrate according to claim 11, wherein when the second switching line is turned on, the two groups of detecting lines are a group consisting of the first, the third and the fifth detecting lines, and a group consisting of the second, the fourth and the sixth detecting lines respectively.

13. The array substrate according to claim 11, wherein the detecting signal access unit comprises a first to a third detecting points;
　　wherein the first ends of the first to the third detecting points each are connected with a corresponding signal sharing point of the first to the third signal sharing points, so as to provide the first detecting signal to the three groups of detecting lines in sequence; and
　　wherein the second ends of the first and the third detecting points each are connected with a corresponding signal sharing point of the fourth and the fifth signal sharing points, so as to provide the second detecting signal to the two groups of detecting lines in sequence.

14. The array substrate according to claim 13, wherein the switching signal access unit comprises a first control switch and a second control switch, the first control switch being connected with the first control line so as to provide a first control signal, the second control switch being connected with the second control line so as to provide a second control signal, the polarity of the first control signal being opposite to that of the second control signal.

15. The array substrate according to claim 8, wherein when the first switching line is turned on, the first detecting signal is provided to the three groups of detecting lines in sequence so as to detect defects of the charge line and the share line of each row of sub area; and
　　wherein when the second switching line is turned on, the second detecting signal is provided to the two groups of detecting lines in sequence so as to detect defects of the charge line and the share line of adjacent rows of sub area.

16. The array substrate according to claim 8, wherein when the first switching line is turned on, a difference between the row numbers of the sub areas which receive the first detecting signal through a corresponding charge line is a multiple of three.

17. The array substrate according to claim 13, wherein when the first switching line is turned on, the first detecting signal is provided to the three groups of detecting lines in sequence so as to detect defects of the charge line and the share line of each row of sub area; and
　　wherein when the second switching line is turned on, the second detecting signal is provided to the two groups of detecting lines in sequence so as to detect defects of the charge line and the share line of adjacent rows of sub area.

18. The array substrate according to claim 13, wherein when the first switching line is turned on, a difference between the row numbers of the sub areas which receive the first detecting signal through a corresponding charge line is a multiple of three.

19. The array substrate according to claim 14, wherein when the first switching line is turned on, the first detecting signal is provided to the three groups of detecting lines in sequence so as to detect defects of the charge line and the share line of each row of sub area; and
　　wherein when the second switching line is turned on, the second detecting signal is provided to the two groups of detecting lines in sequence so as to detect defects of the charge line and the share line of adjacent rows of sub area.

20. The array substrate according to claim 14, wherein when the first switching line is turned on, a difference between the row numbers of the sub areas which receive the first detecting signal through a corresponding charge line is a multiple of three.

* * * * *